United States Patent [19]
Jou et al.

[11] Patent Number: 5,568,423
[45] Date of Patent: Oct. 22, 1996

[54] FLASH MEMORY WEAR LEVELING SYSTEM PROVIDING IMMEDIATE DIRECT ACCESS TO MICROPROCESSOR

[75] Inventors: Edwin Jou, Irvine; James H. Jeppesen, III, Lake Forest, both of Calif.

[73] Assignee: Unisys Corporation, Blue Bell, Pa.

[21] Appl. No.: 422,119

[22] Filed: Apr. 14, 1995

[51] Int. Cl.⁶ .................................................. G11C 16/02
[52] U.S. Cl. ............................. 365/185.33; 365/185.29; 365/185.11; 395/430
[58] Field of Search .................................. 365/218, 900, 365/185.11, 185.29, 189.33, 230.03; 395/401, 430

[56] References Cited

U.S. PATENT DOCUMENTS 5,341,339  8/1994  Wells ...................................... 365/218
5,388,083  2/1995  Assar ...................................... 365/218
5,406,529  4/1995  Asano ................................. 365/230.03

*Primary Examiner*—David C. Nelms
*Assistant Examiner*—Son Mai
*Attorney, Agent, or Firm*—Alfred W. Kozak; Mark T. Starr; Steven R. Petersen

[57] ABSTRACT

A system for equal utilization of blocks of flash memory whereby a processor using algorithmic software functions to sort the usage-value of each block of flash memory so that the system will select the least-used memory block for the next cycle of memory usage. The described system provides direct and immediate access of flash memory to the microprocessor without any intermediate modules or vias which would delay that access. Further, a minimal amount of overhead header information is only required for each flash memory block thus allowing greater areas of memory usage for instructional code data.

4 Claims, 5 Drawing Sheets

FLASH MEMORY WEAR LEVELING SYSTEM PROVIDING IMMEDIATE DIRECT ACCESS TO MICROPROCESSOR

FIELD OF THE INVENTION

This disclosure relates to the more efficient use of flash memory devices in computer and digital systems.

BACKGROUND OF THE INVENTION

In recent times with the advent of more sophisticated computer and digital systems, various memory devices have been developed to enhance the versatility of computer networks and digital systems.

One of the more recent memory developments has been the type of memory designated as "flash memory".

The flash memory is a type of non-volatile memory which is very similar to EEPROM memory in function. EEPROM is the Electrical Erasable Programmable Read Only Memory which can be erased by applying an electrical signal to one or more of its pins. These occur as a type of chip which is useful for applications requiring storage that is stable for long periods of time without power, but additionally might also need to be reprogrammed from time to time, and this reprogramming can be done while the chip is still on the circuit board. However the reprogramming cycles are limited so that after a certain number of times the reprogramming is no longer useable due to a wearing out of the internal circuitry.

The flash memory is somewhat similar to the EEPROM memory in function. However, it must be erased in "blocks", while on the other hand the EEPROM can be erased one byte at a time.

Due to its block-oriented nature, a flash memory is often used as a supplement to or replacement for hard disks in portable computers.

Flash memory can be built into a unit or it can be made available as a printed circuit card that can be plugged into a slot in a digital module.

One singular disadvantage of the block-oriented nature of the flash memory is that an entire block must be erased and data rewritten to change any single byte of information.

However, flash memory is very useful since it is used by manufacturers and software publishers to distribute software which is either built into the system or installed on a printed circuit card. When the software is installed in a printed circuit card, it is further useful in that the software can be upgraded while in the field.

The flash memory, generally built on a chip, is a block-oriented non-volatile memory device which, however, has a limited life span of about 100,000 erase/write cycles for each block of memory. A chip may provide storage for several blocks of flash memory. When computer networks or digital modules use flash memory, a problem occurs in that when a flash memory is used, the usage will concentrate on a few of the blocks, generally the first few blocks in the flash memory address space and as a result, these blocks tend to be worn out well before all the other blocks have had a chance to be exercised and used.

As a result of this, flash memory useable size will be seen to shrink quickly and come to a point that failure occurs since there is an over-utilization of the first few blocks in the flash memory address space. As a result of this, a failure to write data will occur prematurely, thus presenting a minimum working space even while some of the flash memory blocks may still not have been used.

The presently described system functions to obviate the situation where the first few address space blocks of the flash memory are continually used and other blocks neglected. This is accomplished by ensuring that there is an equal distribution of usage of all of the memory blocks, rather than just a few in the early address areas. Thus, the present system may be seen to operate as a "wear leveling" fairness of usage scheme. Not only does the present system insure equal distribution of usage of flash memory blocks, but further provides for immediate and direct access by the microprocessor to the flash memory without need for intervening stages or special protocol arrangements which increase the overhead of the operations in accessing the flash memory system.

SUMMARY OF THE INVENTION

A flash memory, having multiple blocks of memory area, is used in a digital system which provides an algorithm to ensure that there is an evenness of distribution among the various memory blocks of memory usage rather than concentration on one area or one memory block of the flash memory which will tend to over use these areas resulting in an early possibility of failure.

The wear leveling system of the present disclosure, will operate to guarantee that the usage of each and every block within the flash memory address space will be equally utilized or fairly distributed. A software algorithm in a RAM memory is available to a microprocessor which utilizes a PROM and a static RAM (SRAM) in order to maintain a count of the number of times that a given block in the flash memory has been used. The present system permits direct access from the central microprocessor to the flash memory units without need for intervening modules, controllers or devices. Thus, not only delay time is obviated, but also many types of header overhead are eliminated.

Then according to the list of usage of each of the blocks, the system will choose, for next memory usage, the block having the numerical least number of usage cycles for the next operation.

As a result of this continual accounting, there will be no one block or set of blocks which are over used and each of the memory blocks in the flash memory will have an opportunity to be used when the usage count-value of metered information shows it has not been sufficiently used.

DESCRIPTION OF PREFERRED EMBODIMENT

Figure 1:
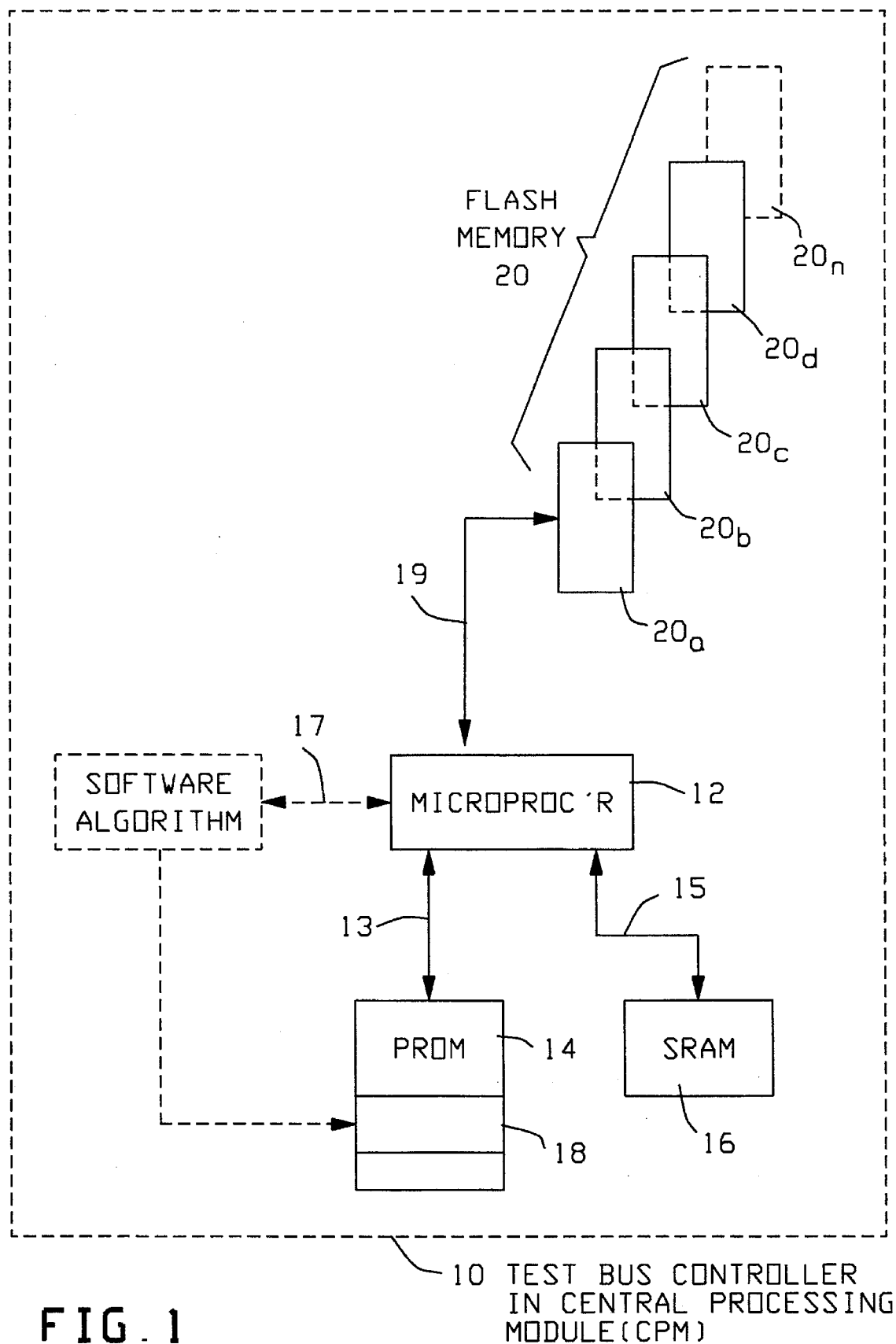
FIG. 1 is a block diagram of a digital system having a processor and several memories in order to operate a series of blocks of flash memory.

Referring to FIG. 1, there is indicated a typical digital system in which a microprocessor 12 connects via bus 19 to a flash memory 20 which has typical useable memory blocks designated as $20_a$, $20_b$, $20_n$, etc.

Figure 2A:
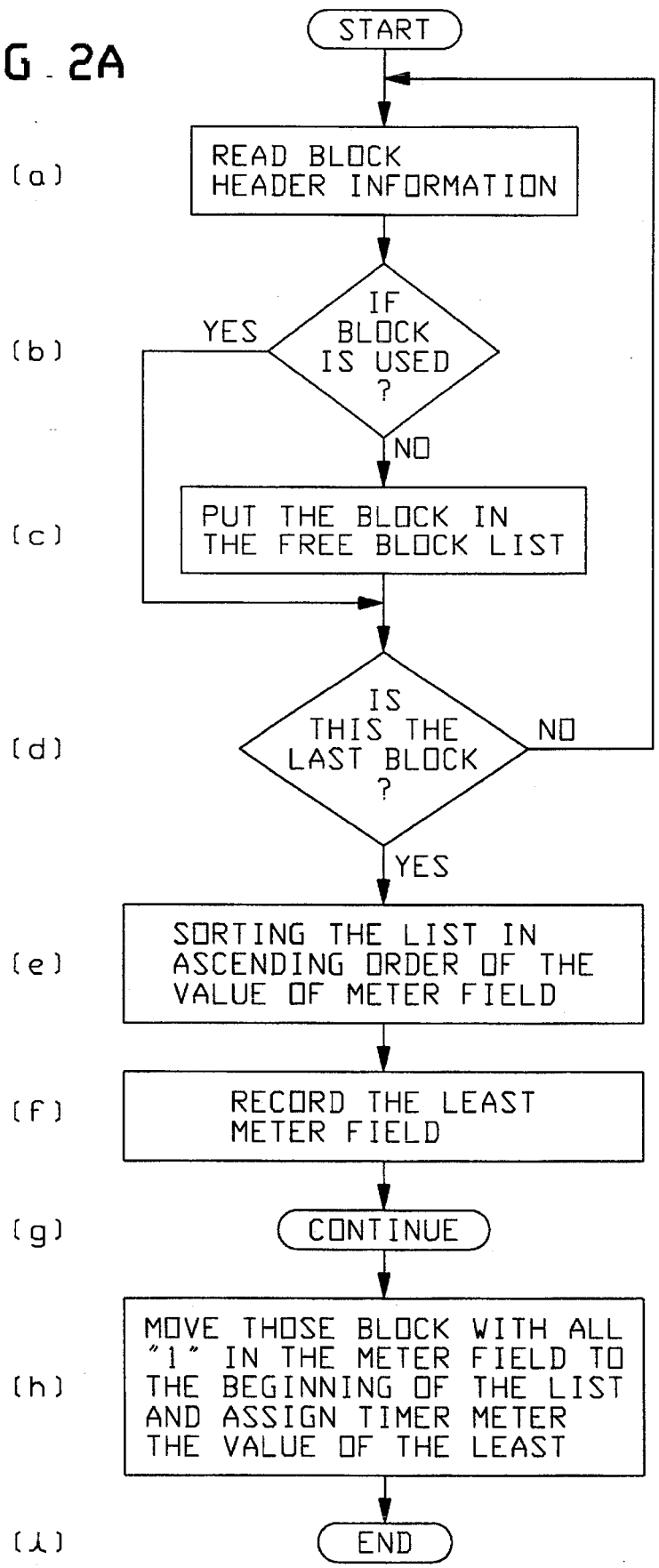
FIG. 2A is a flow chart indicating the steps required in constructing a "free block" list.
Figure 2B:
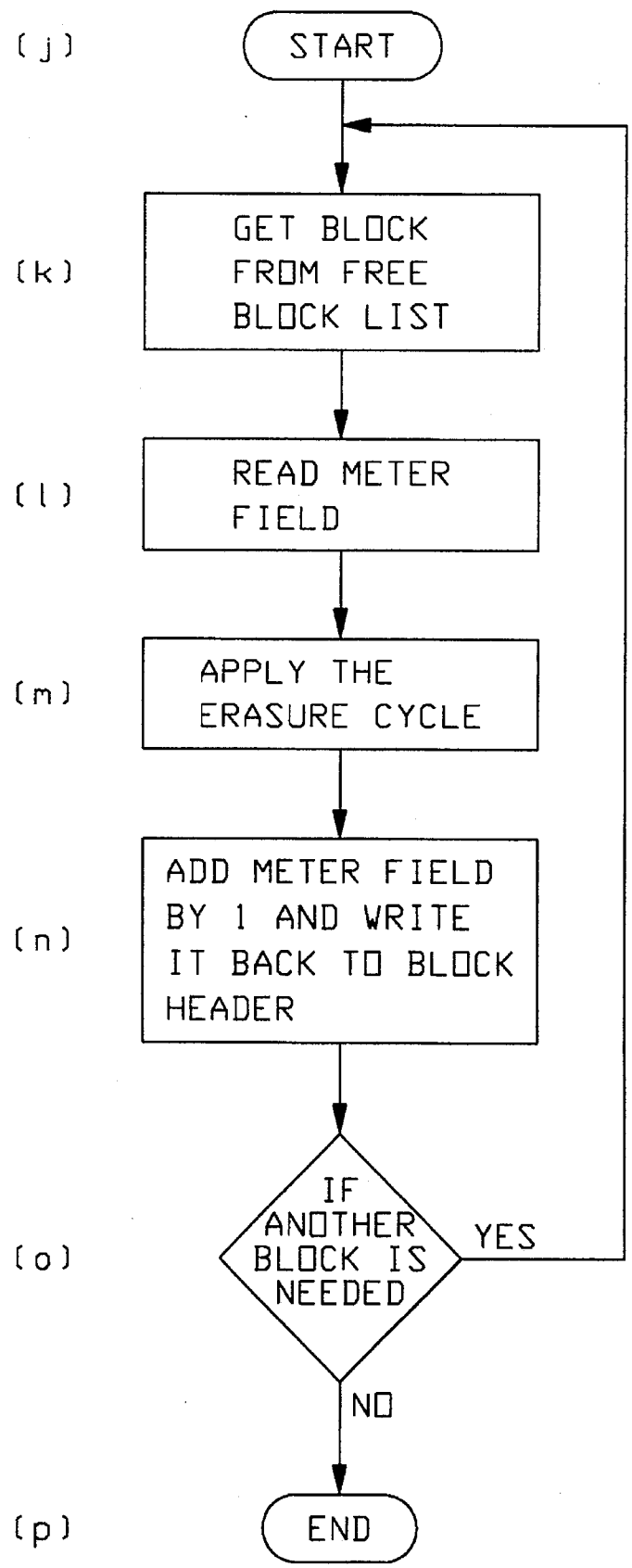
FIG. 2B is a flow chart indicating the steps required to update the meter field in the block header.

The microprocessor 12 is supported by a PROM memory module 14 for holding code and data, which additionally has a RAM 18 within which it provides the software algorithmic functions shown in FIGS. 2A and 2B.

Figure 5:
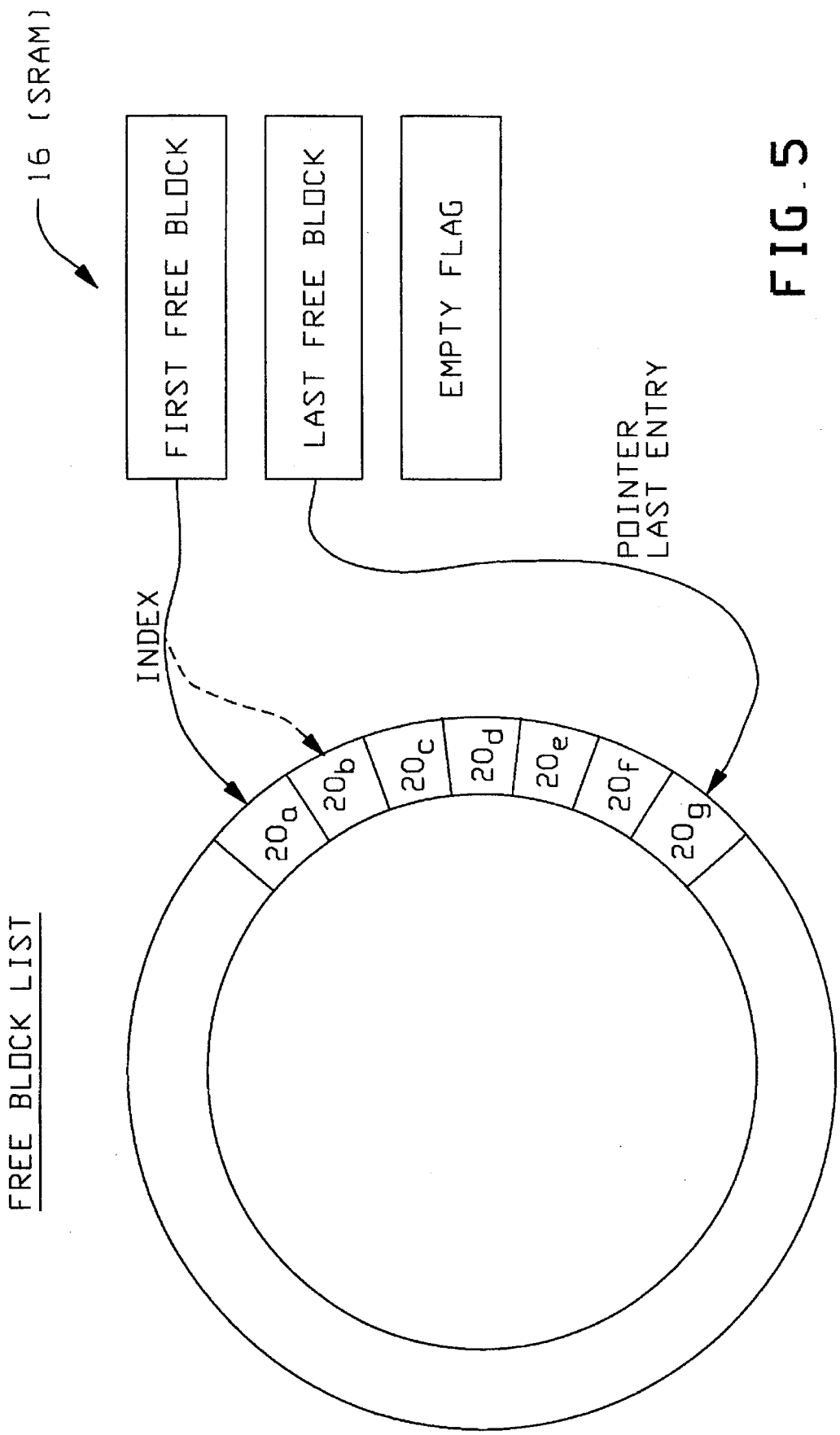
FIG. 5 is a drawing of the function performed in the static RAM 16 which keeps a record of the free block list.

The microprocessor 12 is further enhanced by the use of a SRAM 16 which stores and monitors the free block list shown in FIG. 5.

The microprocessor 12 working in cooperation with the PROM, the PROM 14 and the SRAM 16 functions to make use of the flash memory 20 in a fashion such that the wear or usage of the blocks of the flash memory 20 will be evenly distributed and so that no one particular flash memory block will be overused, overloaded and subject to early failure.

Each one of the flash memory blocks, $20_a$, $20_b$ ... $20_n$, will be seen in FIG. 3, to have a portion designated as the header and a portion designated as a 16 bit meter field. The 16 bit meter field is used to maintain a count of the number of times that the block has been erased, thus indicating the amount of usage involved of the particular flash memory block.

Figure 3:
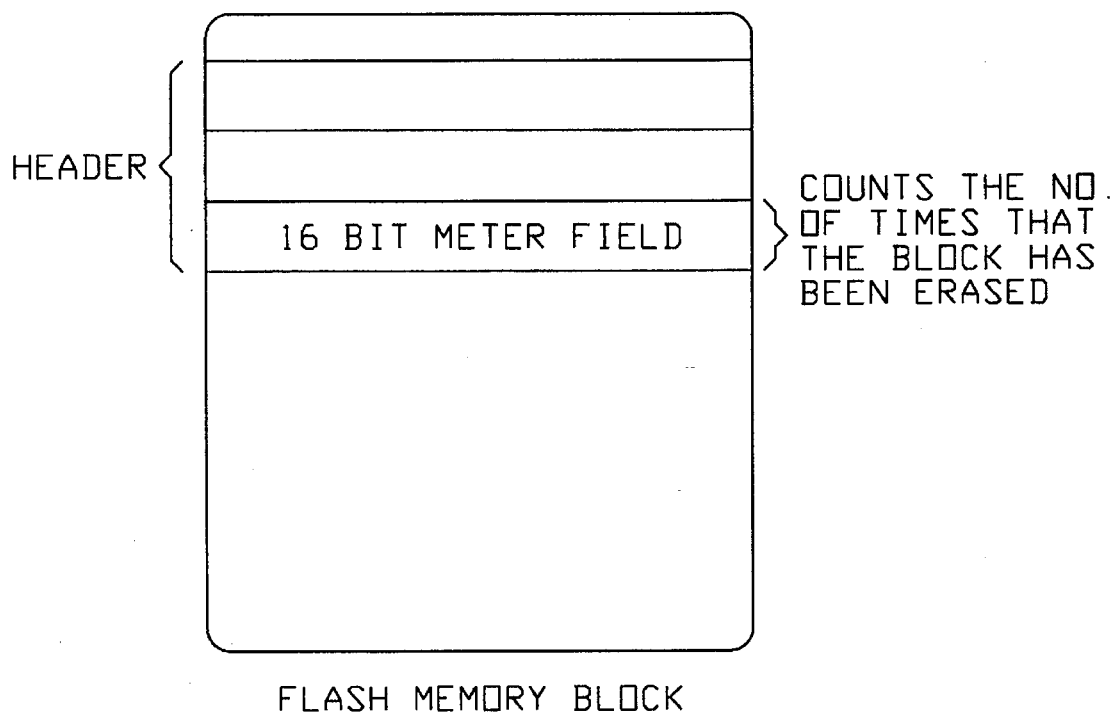
FIG. 3 is a schematic drawing of a typical flash memory block showing the header area and the meter field.

In the present embodiment, each of the individual flash memory units $20a$, $20b$, $20c$ ... $20n$ will each have a series of individual blocks holding 64K words. Then as seen in FIG. 3, each memory block unit $20n$ has a header of 20 bytes which includes 2 bytes for the metering field which counts the number of times that the block has been erased. However, the 20 bytes of header information (which is the equivalent of 10 words) supports the storage of 64K words in that particular memory block unit. Thus the overhead for 64K words is basically equal to or less than 10 words of overhead for 64K words of data. Because of this ratio of overhead to data, much usable instruction code data space is usable and not wasted as with systems which require a much greater amount of overhead data words in order to handle a limited number of data bytes of code.

Figure 4:
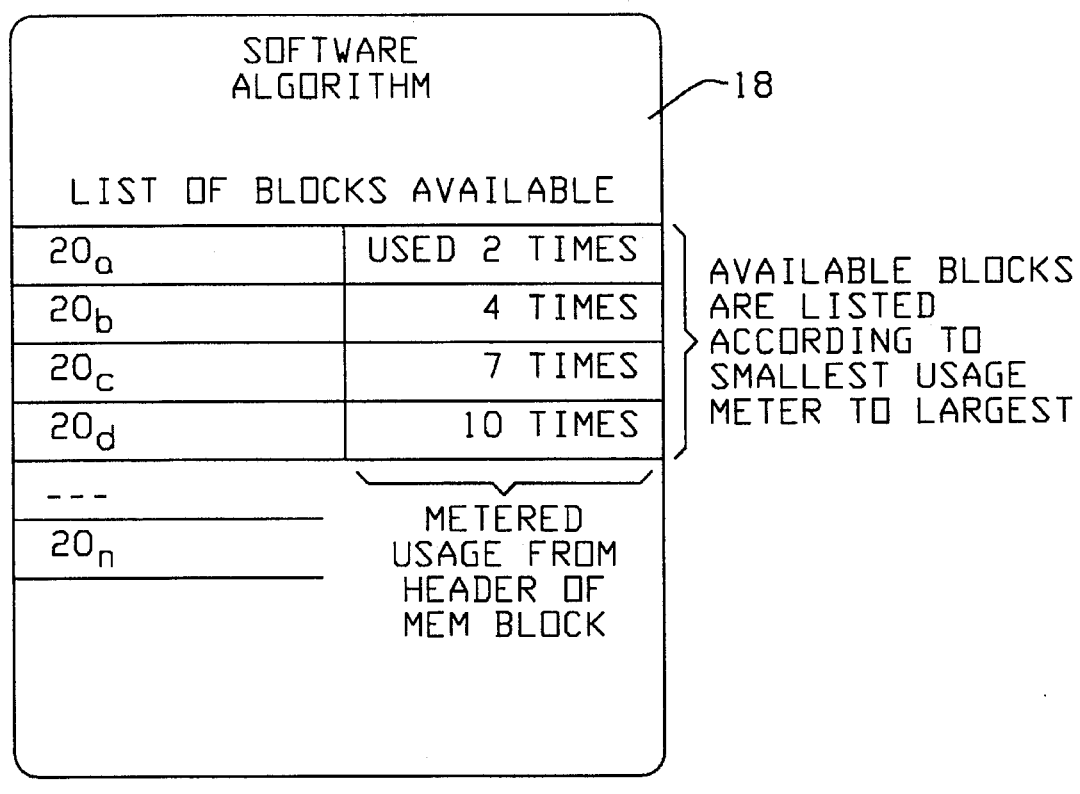
FIG. 4 is a schematic drawing of the recordkeeping function by the RAM 16 which maintains a record of the available flash memory blocks and the current number of usages for each block.

FIG. 4 is a schematic drawing of the function of a software algorithm in RAM 18, which uses SRAM 16 where a record is kept of each of the flash memory blocks $20_a$, $20_b$ ... $20_n$. Each block is correlated to a "usage number" which is derived from the header of each of the memory blocks $20_a$, $20_b$ ... $20_n$.

A wear leveling algorithm is embedded in the PROM 18 which is used to construct in SRAM 16, a list designated as the "free block" list. This is illustrated in steps (a through i) in the flow chart of FIG. 2A.

The subsequently then flow chart 2B illustrates the steps for updating the meter field in the block header of FIG. 3.

Referring to the flow chart of FIG. 2A, the following steps are performed:

(a) The processor 12 reads the block header information from the flash memory blocks $20_a$, $20_b$ ... $20_n$.

(b) If the block is not used, a decision is made at step (b). This is done at step (c).

(c) If the block has not been used, then the block identification address is placed in the free block list which will be illustrated in FIG. 5. The free block list is placed in the Static RAM, SRAM 16.

If the block is already used, then step (c) is skipped and the operation is initiated on to step (d).

(d) At this step, a decision is made as to whether this is the last block of the series of blocks $20_a$, $20_b$ ... $20_n$. If this is not the last block, then the operation is returned back to the starting point to resume at step (a). However, if this is the last block, that is to say, block $20_n$, then the next functional step is step (e).

(e) At step (e) the microprocessor 12 uses the sorting algorithm in RAM 18 in order to sort the list in the ascending order of the value of the meter field. That is to say, the less usage of a given block, the higher it is placed on the top of the list.

(f) At this step (f), a record is made of the least-valued meter field.

(g) When the least meter field block identification is recorded, then using step (g), this is provided to the operations of step (h).

(h) At this step, the algorithm will find each flash memory block having all "1's" in the meter field, and these block identifications will be moved to the beginning of the list as seen in FIG. 4. Thus, the list identifications of each flash memory block in FIG. 4, will be arranged according to those starting with the "least used" block down to the most used block. Thus, as seen in FIG. 4, there is provided a "free block" list which shows the listing of the least used blocks down to the most used blocks.

Referring to the flow chart in FIG. 2B, the processor 12 gets the identity of the "next useable" block from the free block list of FIG. 4.

(k) Here, the processor gets the identity of the block from the free block list.

(l) The processor 12 now reads the meter field for that block as was seen in FIG. 3.

(m) In this step, the processor activates an erasure cycle which wipes out the remaining items of memory data in that particular flash memory block.

(n) At this step, the processor increments the meter field (FIG. 3) by "1" for that particular memory block and writes this Figure back to the block header field (FIG. 3).

(o) At this step, a decision is indicated as to whether another block is needed. If another block is needed for updating the meter field, then the steps are started back at step (j). If no other blocks are needed, then the steps are completed or ended at step (p).

Thus, there has been an updating of the meter field in each block header of each of the flash memory blocks $20_a$ ... $20_n$.

As a note to step (h) of FIG. 2A, the all "1's" situation in the meter field occurs when memory operation to that block is terminated after the erasure cycle is completed and before the write cycle starts.

The addition of a "1" to the meter field indicates that the block was "erased" one time.

The use of the free block list and the meter field allows this system to indicate which flash memory block has the "least usage" so that this block will be chosen to store the next available data which requires storage. This choice is done by the microprocessor 12 of FIG. 1.

The static RAM 16 of FIG. 1 provides a storage area of the free block list for the microprocessor 12. For example, as seen in the schematic drawing of a circular nature in which the various flash memory blocks are identified in sequence from $20_a$, $20_b$ ... $20_g$.

An index pointer indicates the first free block as $20_a$ and the last free block is $20_g$.

The function of the "empty flag" block is to indicate that there is no block of memory available in the "free block" list.

Thus, if there is no block available in the free block list, the empty flag will be set. When this is set, this indicates there is no block available for flash memory storage. The "empty flag" is located in the RAM 16 of FIG. 1.

Operationally, in order for the processor to get a block identity from the free block list, the following situations can arise:

If a given flash memory block is "empty" (empty=true), then an error signal is returned to the processor (caller). The next step is for the processor 12 to retrieve the block index identification from the first free block. After this, since the block has now been used, the processor will increment the first free block by "1".

If the first free block turns out to be the "last" free block (such as block $20_g$), then the signal "empty" is true.

In any case, the processor will select the first free block from the free block list which indicates that that block is the "least used block" at that particular moment in time.

In order to return a block to the free block list, several steps are required. These include:

(a) The processor will advance the last free block by a "1".

(b) The processor will assign the returned block index to the slot pointed at by the last free block.

(c) The processor will set the empty flag to false.

Steps (a), (b), (c) and (d) are involved with information provided in the RAM 16 of FIG. 1 and FIG. 5.

Regarding (a), if it is supposed that the current slot pointed at by the last free block is slot "n", then the system will advance the pointer so that the pointer will point at "n+1", or if the current pointer points to "z", then after the advancement the pointer will be pointed to "0".

Regarding step (b), if it supposed that the block "k" is available and is to be returned to the free block queue, the slot pointed at by the last free block pointer will be holding the index "k".

(c) as above, the processor will set the empty flag in RAM 16 to the "false" indication.

(d) a further step is involved in that of sorting the entries from the first free block to the last free block based on the meter field in ascending order.

In order to prepare for use of the described wear-leveling algorithm, it is necessary to reserve a header on each flash memory block. The header, as seen in FIG. 3, contains all the bookkeeping information and especially provides a field called the "meter field" which is used to record the number of times that a particular block has ever been erased.

A software module in PROM 18 called the "Flash Memory Manager" maintains a list of the available blocks. The list is sorted according to the various meter fields, in ascending order and placed in RAM 16. This ascending order list thus starts with the lower amounts of erasure count values on up to the higher amounts of erasure count values.

Whenever the microprocessor 12 in the embedded system is initialized, the Flash Memory Manager in PROM 18 will search for the available blocks and put them in the list in SRAM 16 based on the meter fields residing in each flash memory block.

The smaller in value the meter field is, the closer it is placed to the beginning of the "free block" list. From this information, the system can retrieve blocks from the beginning of the list.

After one block has been retrieved, the meter field is read into the volatile RAM 16 of FIG. 1, and the erase cycle begins.

All the data in the block, including the header information, will then be wiped-out. Thus, this is the reason that the meter field data has to be stored in the RAM 16 temporarily, incremented by "1" and then written back to the particular block of memory during a Write cycle. Thus, the meter field records the count of the erase cycle amounts that have been utilized.

In the event that the system crashes or the processor gets reset after a given block has been erased, and the new meter field for that block has not been updated, then the meter information would be lost permanently. However, during the processor re-initialization, if the block with the meter field erased is located, then that block will be put at the beginning of the free block list and the meter set to the value of the next higher meter field in the entire block list.

This system of functional operation is better than collecting available blocks from lower-to-higher addresses without sorting. In that particular case, the lower address block will be worn out first before the higher address blocks have a chance to serve as utilized memory addressed. This system also has better advantages over that of randomly shuffling the blocks usage. Randomly shuffling the blocks does not guarantee the fairness of utilization, and further the use of a random number generator algorithm would also increase the complexity of the code involved.

A typical type of flash memory which is often utilized, is a device which is a product of Intel Corporation designated as 28F0085A.

Described herein has been a system for "wear leveling" the multiple memory blocks of a flash memory so that no one particular address area of the flash memory is over-utilized and subject to early failure. Quite contrarily, this system operates so that a metering record is kept of the usage of each block of flash memory and the usage list is continually sorted in order to provide a free list, or priority list, of blocks according to the least amount of usage. From this least-amount-of usage selection, the microprocessor in this system can select the next least-used block of flash memory as the next memory area to be utilized.

Further, the architecture of the system enables the microprocessor to have direct and immediate access to the flash memory means without any intervening modules which would cause time delays. Further, the system provides a minimal amount of overhead data for each large block of instruction code bytes residing in each one of the flash memory block units thus eliminating much wasted space such as is characteristic of other systems.

As a result of this type of fairness and equality of usage throughout the various blocks of flash memory, the reliable utilization time of the flash memory is extended quite considerably and a higher reliability of operation is provided.

While a particular embodiment of the above-mentioned wear leveling scheme for flash memory has been described, it should be understood that other embodiments of the concept may be provided and utilized, but which are encompassed by the following claims.

What is claimed is:

1. In a digital network using a central processor and memory modules including a flash memory, a method for equitable utilization of each block of memory in said flash memory comprising the steps of:

(a) connecting said processor directly to said flash memory for immediate access;

(b) assigning a header area in each block of flash memory which registers the number of times that the block has been utilized and erased, said header also specifically identifying each individual block of said flash memory;

(c) assembling a list identifying each said flash memory block and its numerical value of utilization-erase cycles;

(d) sorting said list into a free block list which organizes each identified block of flash memory in order of least-used block at the top, to the most-used block at the bottom of the list;

(e) selecting the least-used block for erasure and storage utilization of newly placed data therein.

2. The method of claim 1 which includes the step of:

(f) limiting the size of said header area overhead to no more than 10 overhead words for each 64000 words of available data in said flash memory block.

3. A method for providing direct memory access by a microprocessor to a flash memory means while minimizing the time of access and overhead data required, comprising the steps of:

(a) connecting said microprocessor directly to said flash memory for immediate access;

(b) establishing a flash memory means having multiple blocks of instruction codes wherein each block includes a header of less than ten words for each 64,000 words of instruction code, said header including a block identification number and a value representing the number of times the particular flash memory block has been erased;

(c) reading, by said microprocessor means, of the block header information to determine the number of times that the flash memory block has been erased;

(d) establishing a memory unit list which identifies each block and the number of times it has been erased, said list being assembled in ascending order to indicate the least-used block of flash memory up to the most used block of flash memory;

(e) selecting by said microprocessor means, of the flash memory block having the least used value of memory erasures as the next flash memory block area to be utilized;

(f) erasing the selected least-used flash memory block and writing in new instruction code data including incrementing by one the value of the usage field in the header;

(g) utilizing an auxiliary memory to hold the header information of the flash memory block unit to be next utilized while said flash memory block unit is being erased;

(h) returning said temporarily stored header information to the next used flash memory block with a usage value incremented by one.

4. A network for insuring that a central microprocessor means will make equal utilization of the multiple memory block units of a flash memory means while having direct access and connection to said flash memory means and also minimizing the amount of overhead and time delay involved, said network comprising:

(a) said microprocessor means, having direct access connection to said flash memory means, for initiating command cycles for erasing and writing into a selected block of said flash memory means including:

(a1) means to select that block of flash memory having the smallest number of erase-write cycles;

(b) first memory means for holding instruction codes for said microprocessor;

(c) second memory means for holding software instruction codes to enable said microprocessor to list and sort each block unit according to its header value meter field which indicates the numbered value of its erase-write cycles;

(d) scratch memory means for holding a current list of erase-write cycle usage values of each one of said flash memory block units of said flash memory means, including:

(d1) means for temporary storage of header data of any selected flash memory block which is being erased for subsequent usage;

(e) said flash memory means for holding multiple block units of memory storage of instruction codes where each block unit includes:

(e1) a header area for identifying the particular flash memory block and including:

(e1a) said meter field for continually indicating the utilization number value of that block in terms the number of erase-write cycles it has been subjected to.

* * * * *